United States Patent [19]
Tsuru et al.

[11] Patent Number: 5,874,926
[45] Date of Patent: Feb. 23, 1999

[54] MATCHING CIRCUIT AND ANTENNA APPARATUS

[75] Inventors: Teruhisa Tsuru, Kameoka; Harufumi Mandai, Takatsuki; Toshifumi Oida, Omihachiman; Yoichiro Suga, Shiga-ken, all of Japan

[73] Assignee: Murata Mfg Co. Ltd, Kyoto, Japan

[21] Appl. No.: 815,277

[22] Filed: Mar. 10, 1997

[30] Foreign Application Priority Data

Mar. 11, 1996 [JP] Japan .................................. 8-053165

[51] Int. Cl.[6] ........................................................ H01Q 1/50
[52] U.S. Cl. ............................ 343/860; 343/861; 343/713
[58] Field of Search .................................... 343/860, 713, 343/861, 704, 728; 333/17.3, 32; 455/115

[56] References Cited

U.S. PATENT DOCUMENTS

| | | | |
|---|---|---|---|
| 4,087,817 | 5/1978 | Sawicki et al. .......................... | 343/728 |
| 4,476,578 | 10/1984 | Gaudin et al. .......................... | 343/860 |
| 4,799,066 | 1/1989 | Deacon ................................. | 343/860 |
| 5,334,988 | 8/1994 | Murakami et al. ...................... | 343/704 |

FOREIGN PATENT DOCUMENTS

| | | |
|---|---|---|
| 346089 | 12/1989 | European Pat. Off. . |
| 410705 | 1/1991 | European Pat. Off. . |
| 531125 | 3/1993 | European Pat. Off. . |
| 687030 | 12/1995 | European Pat. Off. . |
| 759646 | 2/1997 | European Pat. Off. . |

*Primary Examiner*—Don Wong
*Assistant Examiner*—Hoang Nguyen
*Attorney, Agent, or Firm*—Ostrolenk, Faber, Gerb & Soffen, LLP

[57] ABSTRACT

A matching circuit and an antenna apparatus which, though small-sized, can be used in a radio apparatus which transmits and receives radio waves having a wide range of frequencies. A matching circuit includes an inductance element formed of a chip inductor connected in series with an antenna body, a first capacitance element formed of a trimmer capacitor, and a second capacitance element formed of a chip capacitor, which capacitance elements are connected between respective ends of the inductance element and a ground terminal, and thus in parallel to the antenna body. One end of the inductance element is connected to the power supply terminal of the antenna body, and the other end is connected to a power source for applying a voltage to the antenna body. The first capacitance element is connected between a ground and the connection point of the power supply terminal of the antenna body and the inductance element. The second capacitance element is connected between a ground and the connection point of the inductance element and the power source.

32 Claims, 5 Drawing Sheets

MATCHING CIRCUIT AND ANTENNA APPARATUS

BACKGROUND OF THE INVENTION

1. Field of the Invention

The present invention relates to a matching circuit and an antenna apparatus employing the same and, more particularly, to a matching circuit and an antenna apparatus for use in a radio apparatus which transmits and receives radio waves having a wide range of frequencies, for example, a television, a radio or a pager.

2. Description of the Related Art

Generally, as antenna bodies used in radio apparatus which transmit and receive radio waves having a wide range of frequencies, for example, televisions (90 to 800 MHz), there are Yagi and Uda antennas, whip antennas and the like. However, in the case of Yagi, Uda and whip antennas, since the bandwidth is widened so as to receive radio waves having a wide range of frequencies, the antenna become greatly enlarged.

As compared with the above antennas, an antenna apparatus 50 shown in FIG. 8 has been proposed to achieve a small size. Shown in FIG. 8 are an antenna body 51, a mounting board 52 for mounting the antenna body 51, grounding patterns 53 formed on the mounting board 52, and a transmission line 54 formed similarly on the mounting board 52. The grounding patterns 53 are connected to a ground. Further, the transmission line 54 is connected to a power source V, and the power source V is connected to a ground.

For example, this antenna body 51, as shown in FIG. 9, comprises a rectangular-parallelopiped insulator 55 in which insulator layers (not shown) made of insulator powder of alumina, steatite or the like are laminated, a conductor 56, made of silver, silver-palladium or the like, formed in a coil shape inside the insulator 55, a magnetic substance 57, made of magnetic powder of ferrite powder or the like, formed inside the insulator 55 and the coil-shaped conductor 56, and external connection terminals 58a and 58b which are coated and printed to the extension end (not shown) of the conductor 56 after the insulator 55 is baked.

However, in the above-described conventional small-sized antenna apparatus, the bandwidth is narrow, and therefore, the antenna apparatus cannot be used in a radio apparatus which transmits and receives radio waves having a wide range of frequencies.

The present invention has been achieved to solve the above-described problem. It is an object of the present invention to provide a matching circuit and an antenna apparatus employing the same, which, though small-sized, can be used in a radio apparatus which transmits and receives radio waves having a wide range of frequencies.

SUMMARY OF THE INVENTION

To achieve the above-described and other objects, according to the present invention, there is provided a matching circuit connected to an antenna body, the antenna body comprising a radiation conductor and a power supply terminal and having an equivalent circuit comprising an inductance component, a resistance component and a capacitance component connected in series, the matching circuit comprising an inductance element connected in series with the antenna body, first and second capacitance elements connected to respective terminals of the inductance component in parallel to the antenna body, the first capacitance element comprising a variable capacitance element.

The second capacitance element may also be a variable capacitance element. Further, a matching circuit may be provided on the power supply terminal side of the antenna body.

According to the matching circuit and the antenna apparatus employing the same in accordance with the present invention, using the inductance element and the second capacitance element, it becomes possible to match the input impedance of the antenna body with the characteristic impedance of a high-frequency circuit used in a radio apparatus which transmits and receives radio waves having a wide range of frequencies, and thus it is possible to adjust the resonance frequency, for example with the first capacitance element by using a variable capacitance.

The above and further objects, aspects and novel features of the invention will become more apparent from the following detailed description when read in connection with the accompanying drawings.

DETAILED DESCRIPTION OF EMBODIMENTS OF THE INVENTION

Figure 1:
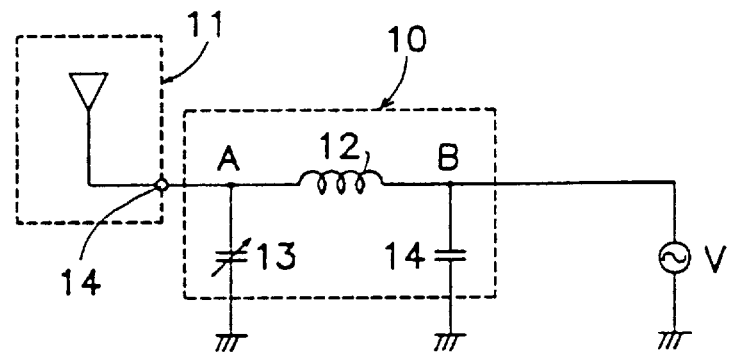
FIG. 1 is a circuit diagram of a first embodiment of a matching circuit according to the present invention.

The preferred embodiments of the present invention will be described below with reference to the accompanying drawings. For all embodiments and modifications, components which are the same or similar to those in the first embodiment are given the same reference numerals, and duplication of the detailed description thereof is avoided.

FIG. 1 is a circuit diagram of a first embodiment of a matching circuit according to the present invention.

Figure 3:
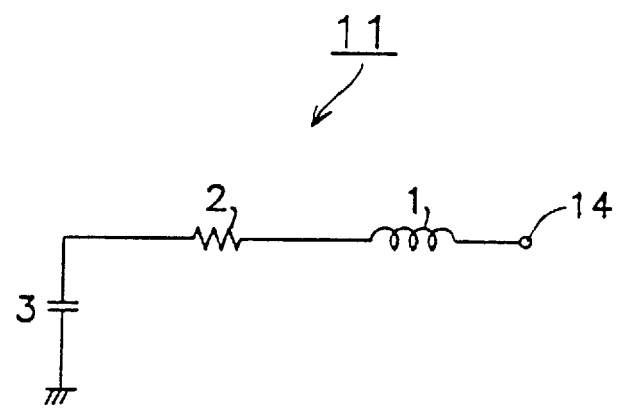
FIG. 3 is an equivalent circuit diagram of an antenna body which constitutes the antenna apparatus shown in FIG. 2.

A matching circuit 10 comprises an inductance element 12 formed of a chip inductor connected in series with an antenna body 11, a first capacitance element 13 with variable capacitance formed by, for example, a trimmer capacitor and a varactor diode, and a second capacitance element 14 with fixed capacitance formed by, for example, a chip capacitor, which capacitance elements 13 and 14 are connected between respective terminals of the inductance element 12 and ground, and thus essentially in parallel to the antenna body 11 (viewed as the equivalent circuit of FIG. 3).

In this case, one end of the inductance element 12 is connected to a power supply terminal 15 of the antenna body 11, and the other end is connected to a power source V for supplying a voltage to the antenna body 11. Further, the first capacitance element 13 is connected between a ground and a connection point A of the power supply terminal 15 of the antenna body 11 and the inductance element 12, and the second capacitance element 14 is connected between a ground and a connection point B of the inductance element 12 and the power source V.

Figure 2:
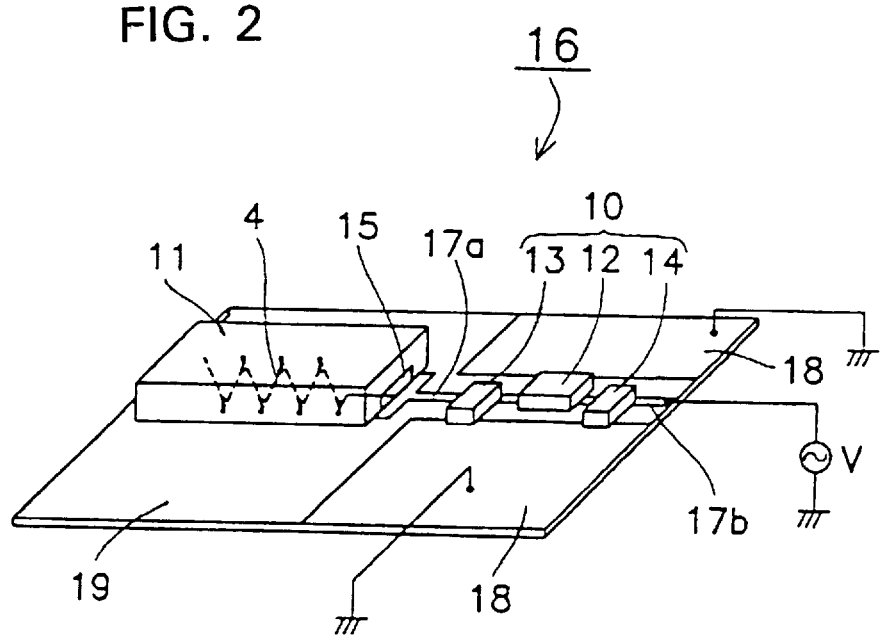
FIG. 2 is a perspective view of an antenna apparatus employing the matching circuit shown in FIG. 1.

FIG. 2 shows a perspective view of an antenna apparatus 16 employing the matching circuit 10 of the first embodiment. This antenna apparatus 16 is formed such that the antenna body 11, and the first capacitance element 13 the second capacitance element 14 and the inductance element 12, which constitute the matching circuit 10, are mounted on a mounting board 19, on the surface of which transmission lines 17a and 17b are formed.

In this case, the power supply terminal 15 of the antenna body 11 is connected to the transmission line 17a, the first capacitance element 13 is connected to the transmission line 17a, the second capacitance element 14 is connected to the transmission line 17b, the inductance element 12 is connected between the capacitance elements, and the power source V is connected to a transmission line 17b. That is, the first capacitance element 13 is connected to the antenna body 11 and the power source V via the transmission lines 17a and 17b and inductance element 12. Further, the first capacitance element 13 is connected between the transmission line 17a and a grounding electrode 18, and the second capacitance element 14 is connected between the transmission line 17b and the grounding electrode 18.

Generally speaking, high-frequency circuits (not shown) incorporated in a radio apparatus which, together with the antenna apparatus 16, transmits and receives radio waves having a wide range of frequencies are designed with their characteristic impedance standardized to 50Ω.

Next, a description will be given of the antenna body 11 used in the antenna apparatus 16 shown in FIG. 2.

The equivalent circuit of the antenna body 11, as shown in FIG. 3, is formed into a circuit in which an inductance component 1, a resistance component 2 and a capacitance component 3 are connected in series between the power supply terminal 15 and ground. The inductance component 1, the resistance component 2 and the capacitance component 3 form a radiation conductor 4.

Figure 4:
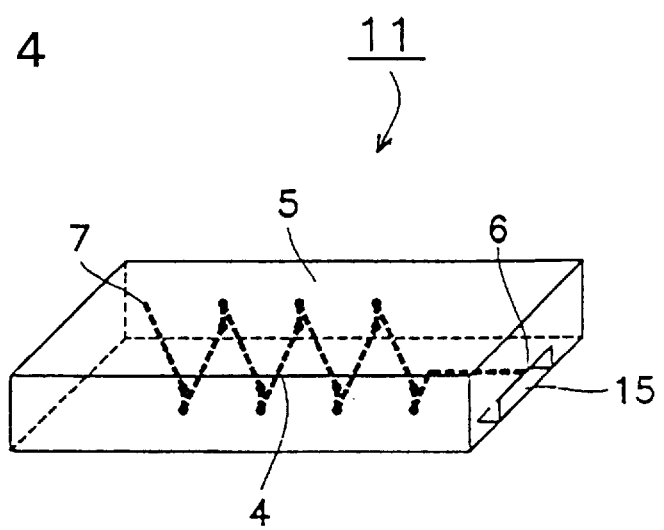
FIG. 4 is a perspective view of the antenna body which constitutes the antenna apparatus shown in FIG. 2.

The antenna body 11, as shown in FIG. 4, comprises a radiation conductor 4 which is wound in a spiral shape along the length direction inside a rectangular parallelopiped base 5 having barium oxide and aluminum oxide as main constituents, and a power supply terminal 15 for applying a voltage to the radiation conductor 4. In this case, one end of the radiation conductor 4 forms a power supply section 6 connected to the power supply terminal 15, and the other end forms a free end 7 inside the base 5.

Figure 5:
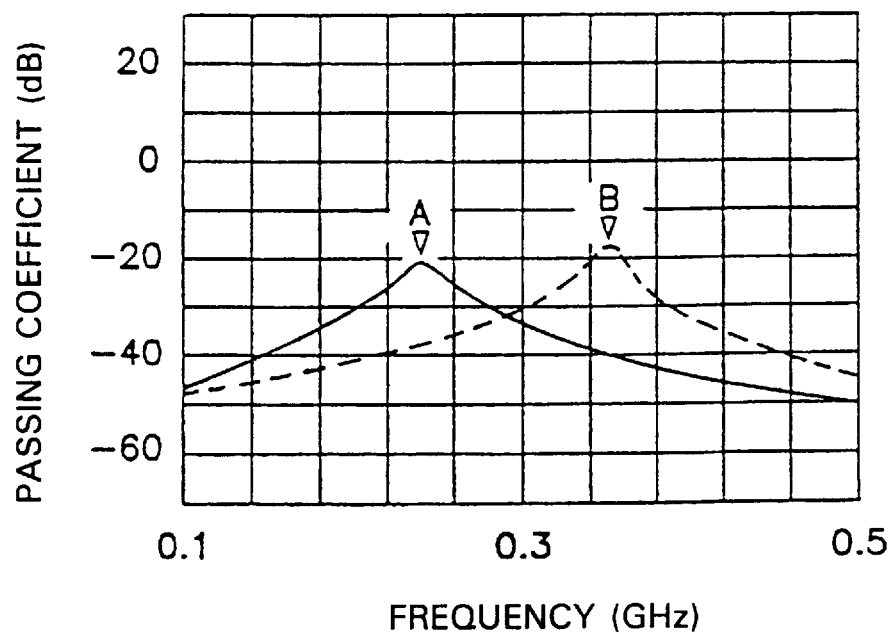
FIG. 5 shows the frequency characteristics of the antenna apparatus shown in FIG. 2.

Next, FIG. 5 shows the frequency characteristics of the antenna apparatus 16 shown in FIG. 2 in a case in which a chip inductor having an inductance value of 220 nH is used for the inductance element 12, a variable capacitor having a capacitance value of 0.1 to 0.75 pF for the first capacitance element 13, and a chip capacitor having a capacitance value of 5 pF for the second capacitance element 14. In FIG. 5, the solid line indicates a case where the capacitance value of the first capacitance element 13 is 0.75 pF, the broken line indicates a case where the capacitance value of the first capacitance element 13 is 0.1 pF, and points A and B indicate resonance frequencies in the respective cases.

It is shown in this figure that by varying the capacitance value of the first capacitance element 13 from 0.1 pF to 0.75 pF, the resonance frequency of the antenna apparatus 16 can be shifted from 350 MHz (point B) to 240 MHz (point A).

According to the matching circuit 10 of the above-described first embodiment, using the inductance element 12 and the second capacitance element 14, it is possible to match the input impedance of the antenna apparatus 16 formed of the antenna body 11 and the matching circuit 10 with 50Ω which is a characteristic impedance of a high-frequency circuit (not shown) incorporated in a radio apparatus which, together with the antenna apparatus 16, transmits and receives radio waves having a wide range of frequencies. Thus, it is possible to adjust the resonance frequency of the antenna apparatus 16 to an intended frequency using the first capacitance element 13 with variable capacitance. Therefore, even if the bandwidth of the antenna apparatus 16 is narrow, it becomes possible to work with radio waves having a wide range of frequencies.

Further, according to the antenna apparatus 16 employing the matching circuit 10, since the antenna body 11 and the matching circuit 10 are integrated and formed to a small size, they can be mounted in a portable radio apparatus which transmits and receives radio waves having a wide range of frequencies. Furthermore, since the antenna apparatus 16 can be housed inside the housing of the radio apparatus which transmits and receives radio waves having a wide range of frequencies, it is possible to eliminate projecting portions from the radio apparatus. In addition, in a case in which a varactor diode whose capacitance can be varied by an applied voltage is used for the first capacitance element 13 with variable capacitance, it is possible to easily adjust the resonance frequency to an intended frequency by merely varying a voltage applied to the varactor diode.

Figure 6:
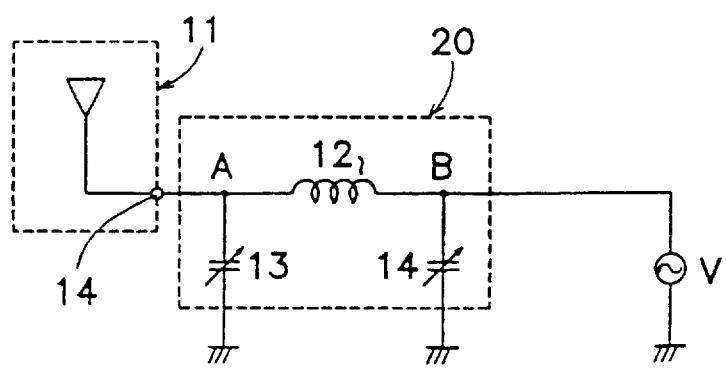
FIG. 6 is a circuit diagram of a second embodiment of a matching circuit according to the present invention.
Figure 7A:
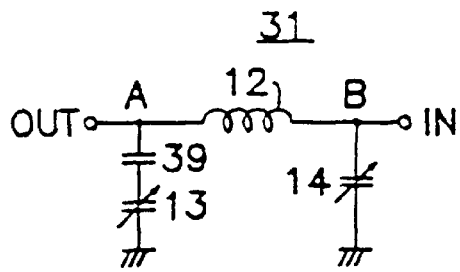
FIGS. 7A, 7B, 7C, 7D, 7E, 7F, 7G and 7H are circuit diagrams illustrating first to eighth modifications of the matching circuit shown in FIG. 6.
Figure 7B:
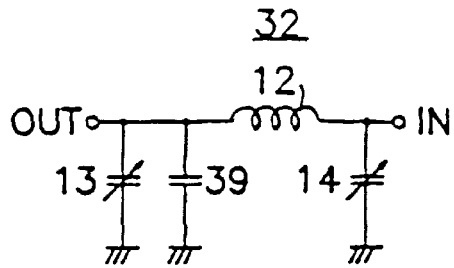
Figure 7C:
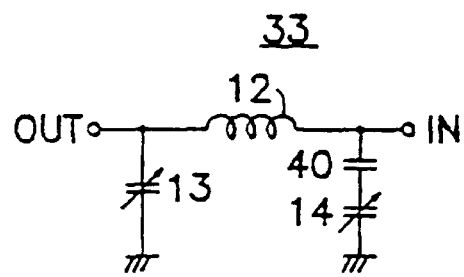
Figure 7D:
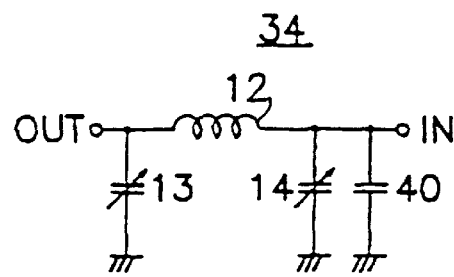
Figure 7E:
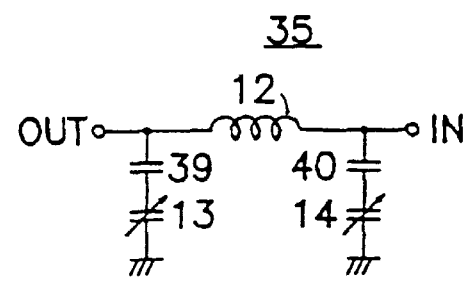
Figure 7F:
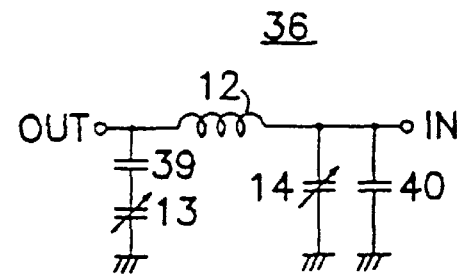
Figure 7G:
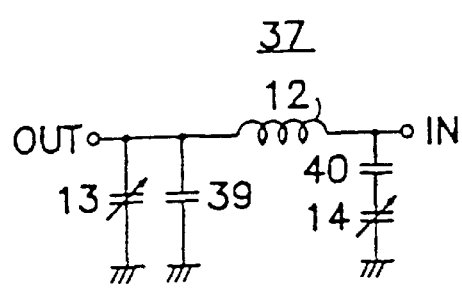
Figure 7H:
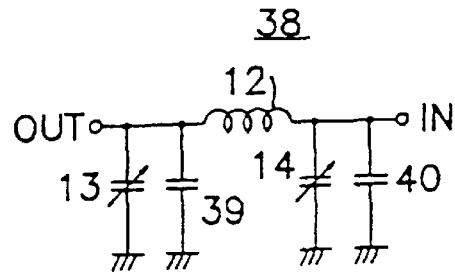
Figure 8:
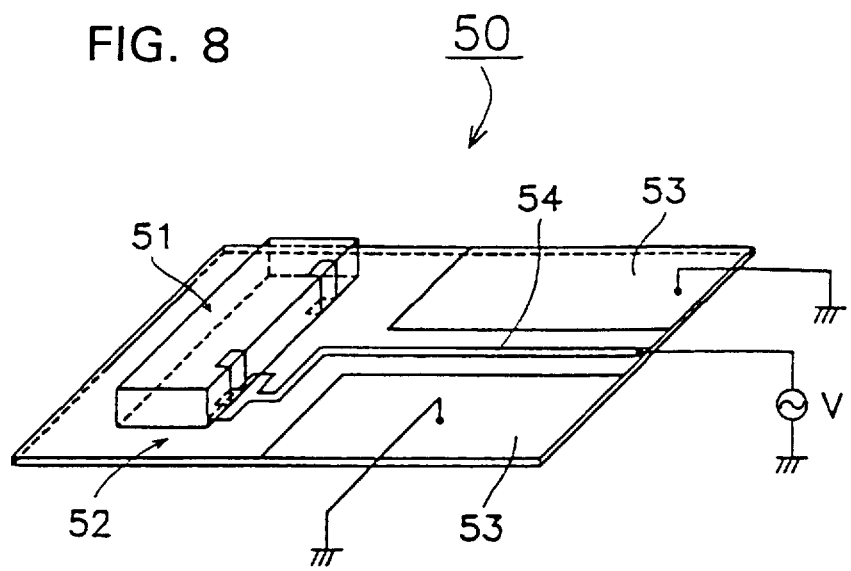
FIG. 8 is a perspective view of a conventional antenna apparatus.
Figure 9:
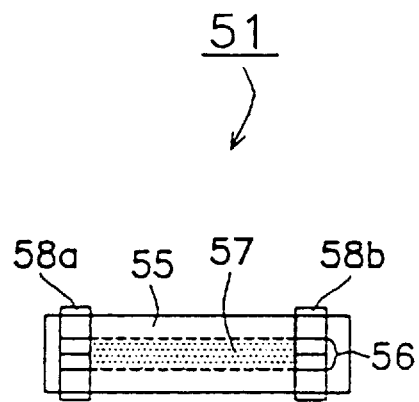
FIG. 9 is a side view of an antenna body used in the antenna apparatus shown in FIG. 8.

FIG. 6 shows a circuit diagram of a second embodiment of a matching circuit according to the present invention.

The matching circuit 20 of the second embodiment differs from the matching circuit 10 of the first embodiment in that a second capacitance element 14 is formed by a capacitance element with variable capacitance. In this case, the second capacitance element 14 with variable capacitance is formed by, for example, a trimmer capacitor and a varactor diode in the same way as the first capacitance element 13.

According to the matching circuit 20 of the above-described second embodiment, even if the input impedance of an antenna apparatus 21 greatly deviates from 50Ω which is the characteristic impedance of a high-frequency circuit (not shown) incorporated in a radio apparatus which, together with the antenna apparatus 21, transmits and receives radio waves having a wide range of frequencies by greatly shifting the resonance frequency of the antenna apparatus 21 formed of the antenna body 11 and the matching circuit 20 in order to reach a desired frequency, it becomes possible to match the input impedance of the antenna apparatus 21 with the characteristic impedance of that high-frequency circuit by varying the capacitance of the second capacitance element 14 whose capacitance is made variable.

FIGS. 7A to 7H show circuit diagrams of first to eighth modifications of the second embodiment.

Matching circuits 31 to 38 of these first to eighth modifications differ from the matching circuit 20 of the first embodiment in that a third capacitance element 39 and a fourth capacitance element 40 are connected in series with or in parallel to the first capacitance element 13 and the second capacitance element 14.

In a case in which the third capacitance element 39 and the fourth capacitance element 40 are connected in series with the first capacitance element 13 and the second capacitance element 14 (FIGS. 7A, 7C, 7E, 7F and 7G), even if the capacitances of the first capacitance element 13 and the second capacitance element 14 whose capacitances are variable are greatly adjusted, the combined capacitance of the first capacitance element 13 and the third capacitance element 39, and the combined capacitance of the second capacitance element 14 and the fourth capacitance element 40 will vary by a very small amount; therefore, it is possible to adjust capacitance slightly.

Further, in a case in which the third capacitance element 39 and the fourth capacitance element 40 are connected in parallel to the first capacitance element 13 and the second capacitance element 14 (FIGS. 7B, 7D, 7F, 7G, and 7H), even if the capacitances of the first capacitance element 13 and the second capacitance element 14 with variable capacitances are slightly adjusted, the combined capacitance of the first capacitance element 13 and the third capacitance element 39, and the combined capacitance of the second capacitance element 14 and the fourth capacitance element 40 will vary by a large amount; therefore, it is possible to adjust capacitance greatly.

In this case utilizing the above-described first and second modifications, by using a capacitance element whose capacitance is fixed as the second capacitance element 14, a modification of the matching circuit 10 of the first embodiment is formed.

Although in the above-described embodiments a case is described in which the antenna body has a conductor wound in a spiral shape inside the base formed of a dielectric material having barium oxide, aluminum oxide and silica as main constituents, the antenna body requires only that the equivalent circuit be a circuit shown in FIG. 3, and its shape is not an indispensable condition for carrying out the present invention.

Further, although a case is described in which a variable capacitor having a capacitance value of 0.1 to 0.75 pF is used as a capacitance element with variable capacitance, the capacitance is required only to be variable, and the variable range of the capacitance is not an indispensable condition for carrying out the present invention.

In addition, although a case is described in which the resonance frequency is made variable, the capacitor may of course be used even when the resonance frequency is not made variable.

According to the matching circuit in accordance with the first aspect of the present invention, the input impedance of the antenna apparatus formed of an antenna body and a matching circuit can be made to match the characteristic impedance of a high-frequency circuit incorporated in a radio apparatus which, together with the antenna apparatus, transmits and receives radio waves having a wide range of frequencies using an inductance element and a second capacitance element, and the resonance frequency of the antenna apparatus can be adjusted to a desired frequency by a first capacitance element whose capacitance is variable. Therefore, even if the bandwidth of the antenna apparatus is narrow, it is possible to work with radio waves having a wide range of frequencies, and it becomes possible to use the antenna apparatus in a radio apparatus which transmits and receives radio waves having a wide range of frequencies.

According to the matching circuit in accordance with the second aspect of the present invention, even if the input impedance of the antenna apparatus greatly deviates from the characteristic impedance of a high-frequency circuit incorporated in a radio apparatus which, together with the antenna apparatus, transmits and receives radio waves having a wide range of frequencies by greatly shifting the resonance frequency of the antenna apparatus formed of the antenna body and the matching circuit in order to reach a desired frequency, it becomes possible to match the input impedance of the antenna apparatus with the characteristic impedance of the high-frequency circuit by varying the capacitance of the second capacitance element with variable capacitance.

According to the antenna apparatus in accordance with the third aspect of the present invention, since the antenna apparatus and the matching circuit are integrated and formed to a small size, it is possible to mount the antenna apparatus in a portable radio apparatus which transmits and receives radio waves having a wide range of frequencies.

Furthermore, since an antenna apparatus can be housed inside the housing of a portable radio apparatus which transmits and receives radio waves having a wide range of frequencies, it is possible to eliminate projecting portions from the radio apparatus.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A matching circuit connected to an antenna body, the antenna body comprising a radiation conductor and a power supply terminal and having an equivalent circuit comprising an inductance component, a resistance component and a capacitance component connected in series, said matching circuit comprising an inductance element connected in series with said antenna body, first and second capacitance elements connected to respective terminals of the inductance element in parallel with the antenna body, the first capacitance element comprising a variable capacitance element; and further wherein the second capacitance element comprises a fixed capacitance element.

2. The matching circuit of claim 1, wherein the resonance frequency of an antenna apparatus comprising the antenna body and the matching circuit can be varied by varying the variable capacitance element.

3. The matching circuit of claim 2, wherein the variable capacitance element can be varied over a range of resonance frequencies of the antenna apparatus.

4. The matching circuit of claim 3, wherein the variable capacitance comprises a varactor diode responsive to an applied voltage thereby to adjust the resonance frequency over the range of resonance frequencies.

5. The matching circuit of claim 1, further comprising a fixed capacitance element in series with said first capacitance element.

6. The matching circuit of claim 1, further comprising a fixed capacitance component in series with said second capacitance element.

7. The matching circuit of claim 1, further comprising a fixed capacitance element in parallel with said first capacitance element.

8. The matching circuit of claim 1, further comprising a fixed capacitance element in parallel with said second capacitance element.

9. An antenna apparatus comprising an antenna body comprising a radiation conductor and a power supply terminal, the antenna body having an equivalent circuit comprising an inductance component, a resistance component and a capacitance component connected in series, and further comprising a matching circuit provided on a power supply terminal side of the antenna body, the matching circuit comprising an inductance element connected in series with the antenna body, first and second capacitance elements connected to respective terminals of the inductance element, the first capacitance element comprising a variable capacitance; and further wherein the second capacitance element comprises a fixed capacitance element.

10. The antenna apparatus of claim 9, wherein the resonance frequency of an antenna apparatus comprising the antenna body and the matching circuit can be varied by varying the variable capacitance element.

11. The antenna apparatus of claim 10, wherein the variable capacitance element can be varied over a range of resonance frequencies of the antenna apparatus.

12. The antenna apparatus of claim 11, wherein the variable capacitance comprises a varactor diode responsive to an applied voltage thereby to adjust the resonance frequency over the range of resonance frequencies.

13. The antenna apparatus of claim 9, further comprising a fixed capacitance element in series with said first capacitance element.

14. The antenna apparatus of claim 9, further comprising a fixed capacitance component in series with said second capacitance element.

15. The antenna apparatus of claim 9, further comprising a fixed capacitance element in parallel with said first capacitance element.

16. The antenna apparatus of claim 9, further comprising a fixed capacitance element in parallel with said second capacitance element.

17. A matching circuit connected to an antenna body, the antenna body comprising a radiation conductor and a power supply terminal and having an equivalent circuit comprising an inductance component, a resistance component and a capacitance component connected in series, said matching circuit comprising an inductance element connected in series with said antenna body, first and second capacitance elements connected between respective terminals of the inductance element and a ground terminal, the first capacitance element comprising a variable capacitance element; and further wherein the second capacitance element comprises a fixed capacitance element.

18. The matching circuit of claim 17, wherein the resonance frequency of an antenna apparatus comprising the antenna body and the matching circuit can be varied by varying the variable capacitance element.

19. The matching circuit of claim 18, wherein the variable capacitance element can be varied over a range of resonance frequencies of the antenna apparatus.

20. The matching circuit of claim 19, wherein the variable capacitance comprises a varactor diode responsive to an applied voltage thereby to adjust the resonance frequency over the range of resonance frequencies.

21. The matching circuit of claim 17, further comprising a fixed capacitance element in series with said first capacitance element.

22. The matching circuit of claim 17, further comprising a fixed capacitance component in series with said second capacitance element.

23. The matching circuit of claim 17, further comprising a fixed capacitance element in parallel with said first capacitance element.

24. The matching circuit of claim 17, further comprising a fixed capacitance element in parallel with said second capacitance element.

25. An antenna apparatus comprising an antenna body comprising a radiation conductor and a power supply terminal, the antenna body having an equivalent circuit comprising an inductance component, a resistance component and a capacitance component connected in series, and further comprising a matching circuit provided on a power supply terminal side of the antenna body, the matching circuit comprising an inductance element connected in series with the antenna body, first and second capacitance elements connected between respective ends of the inductance element and a ground terminal, the first capacitance element comprising a variable capacitance; and further wherein the second capacitance element comprises a fixed capacitance element.

26. The antenna apparatus of claim 25, wherein the resonance frequency of an antenna apparatus comprising the antenna body and the matching circuit can be varied by varying the variable capacitance element.

27. The antenna apparatus of claim 26, wherein the variable capacitance element can be varied over a range of resonance frequencies of the antenna apparatus.

28. The matching circuit of claim 27, wherein the variable capacitance comprises a varactor diode responsive to an applied voltage thereby to adjust the resonance frequency over the range of resonance frequencies.

29. The antenna apparatus of claim 25, further comprising a fixed capacitance element in series with said first capacitance element.

30. The antenna apparatus of claim 25, further comprising a fixed capacitance component in series with said second capacitance element.

31. The antenna apparatus of claim 25, further comprising a fixed capacitance element in parallel with said first capacitance element.

32. The antenna apparatus of claim 25, further comprising a fixed capacitance element in parallel with said second capacitance element.

* * * * *